United States Patent [19]
Chen et al.

[11] Patent Number: 5,930,499
[45] Date of Patent: *Jul. 27, 1999

[54] METHOD FOR MIXED PLACEMENT OF STRUCTURED AND NON-STRUCTURED CIRCUIT ELEMENTS

[75] Inventors: Yulin Chen; Tsu-Wei Ku, both of San Jose; Wei-Kong Chia, Los Altos; Hau-Yung Chen, Saratoga; Rwei-Cheng Lo, Cupertiono, all of Calif.

[73] Assignee: Arcadia Design Systems, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/650,176

[22] Filed: May 20, 1996

Related U.S. Application Data

[63] Continuation of application No. 08/650,176, May 20, 1996.

[51] Int. Cl.⁶ .............. G06F 17/00; G06F 17/50
[52] U.S. Cl. ...................................... 395/500.09
[58] Field of Search .................... 364/488–491, 364/578

[56] References Cited

U.S. PATENT DOCUMENTS

| | | | |
|---|---|---|---|
| 4,597,080 | 6/1986 | Thatte et al. | 371/25 |
| 5,491,640 | 2/1996 | Sharma et al. | 364/488 |
| 5,506,788 | 4/1996 | Cheng et al. | 364/491 |

OTHER PUBLICATIONS

Royannez et al. "A 1.0ns 64–Bits GaAs Adder Using Quad Tree Algorithm," IEEE, pp. 24–28, Mar. 1996.
Kim et al. "A Timing–Driven Data Path Layout Synthesis with Integer Programming," IEEE, pp. 716–719, Nov. 1995.
Usami et al "Hierarchical Symbolic Design Methodology for Large–Scale Data Paths," IEEE, pp. 381–385, Mar. 1991.
Brewer et al "Interconnection Synthesis with Geometric Constraints," IEEE, pp. 158–165, Nov. 1990.
Tsujihashi et al "A High–Density Data–Path Generator with Stretchable Cells," IEEE, pp. 2–8, Jan. 1994.
Rijnders et al "Timing Optimization by Bit–Level Arithmatic Transformations," IEEE, pp. 48–53, Nov. 1995.

*Primary Examiner*—Kevin J. Teska
*Assistant Examiner*—Vuthe Siek
*Attorney, Agent, or Firm*—Wagner, Murabito & Hao

[57] ABSTRACT

The invention resides in a computer-aided design system for defining physical placement and floor-planning of electronic circuits on a given substrate. Improve utilization of substrate area is achieved by arranging circuits into structural (e.g., data-path) and non-structural (e.g., non-data-path) zones for effectively segregated chip or board lay-out. Software is provided to receive a netlist file and determine therefrom which components are categorizable within structural portion. Furthermore, software is provided to produce a lay-out file which defines physical placement of the prototype design, wherein structural components are inter-placed with related control components, for example, to provide sliced-structure placement of a semiconductor chip.

12 Claims, 8 Drawing Sheets

Overall procedure

1. Read in netlist;
2. Read in library
3. Do bus analysis
4. Align bus structure
6. Assign macro block location
7. Assign datapath block location
8. For each datapath block
   8.1 decide aspect ratio
   8.2 do bus analysis
   8.3 assign bit slice to bus signals
   8.4 do probability analysis
   8.5 assign components to bit slice
   8.6 do rectangle coverage from bus signals
   8.7 group the cell from rectangle
   8.9 place the groups by considering timing and routability
   8.10 do routability analysis
   8.11 balance the vertical and horizontal routing resource
   8.12 fine tune the timing within groups
9. Do bus routing to consider cross talk
10. Do performance verification
    go to step 7 if performance is not met
11. Output result

FIGURE 11

|   | 0 | 1 | 2 | ← groups
|---|---|---|---|
| a | 1 | 2 | 0 |
| b | 3 | 1 | 1 |
| c | 1 | 2 | 1 |
| d | 1 | 0 | 1 |
| e | 2 | 1 | 0 |

↑ cells

Figure 7A

|   | 0 | 1 | ← groups
|---|---|---|
| a | 1 | 2 |
| b | 3 | 1 |
| c | 1 | 2 |
| e | 2 | 1 |

↑ cells

Figure 7B

|   | 0 | 1 | 2 | 3 | ← groups
|---|---|---|---|---|
| d | 1 | 0 | 1 | 2 |

↑ cells

METHOD FOR MIXED PLACEMENT OF STRUCTURED AND NON-STRUCTURED CIRCUIT ELEMENTS

This application is a Continued Prosecution of U.S. patent application entitled, "METHOD FOR COMPACT CIRCUIT DESIGN AND PLACEMENT" Ser. No. 08/650,176 Filed May 20, 1996.

BACKGROUND OF THE INVENTION

1. Field of the Invention

The invention relates to computer software, particularly to computer-aided design tools for automating physical lay-out of electronic circuits.

2. Description of Background Art

Computer-aided design tools are used to define and verify prototype electronic circuits and systems, both at physical (i.e., lay-out) and non-physical (e.g., schematic or high-level language) levels of prototype abstraction. At the physical level commercially-available lay-out tools employ various algorithms for placing circuits (e.g., gates, cells, components, etc.) on a given substrate (e.g., semiconductor, printed circuit board, etc.) Because available substrate space is valuable "real estate", it is desirable to provide improved compaction technique for electronic floor-planning and placement.

SUMMARY OF THE INVENTION

The invention resides in a computer-aided design system for defining physical placement and floor-planning of electronic circuits on a given substrate. Improved utilization of substrate area is achieved by arranging circuits into structural (e.g., data-path) and non-structural (e.g., non-datapath) zones for effectively segregated chip or board lay-out Software is provided to receive a netlist file and determine therefrom which components are categorizable within structural portion. Furthermore, software is provided to produce a lay-out file which defines physical placement of the prototype design, wherein structural components are interplaced with related control components, for example, to provide sliced-structure placement of a semiconductor chip.

DETAILED DESCRIPTION OF THE PREFERRED EMBODIMENT

Figure 1:
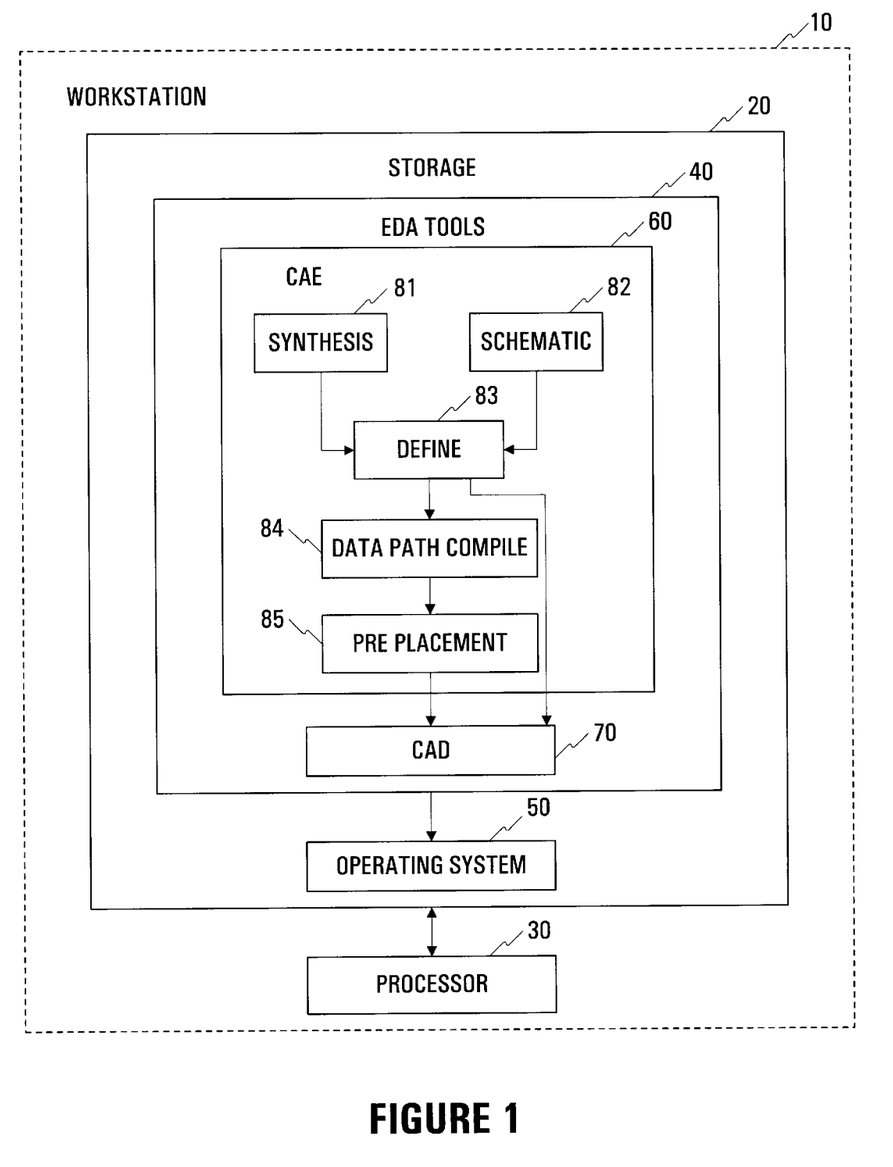
FIG. 1 is a simplified block diagram of a computer system 10 configured for electronic design automation in accordance with the present invention.

FIG. 1 shows engineering workstation 10 in a generalized system block diagram including conventional storage 20, processor 30, and operating system 50 facilities. Electronic design automation (EDA) application suite 40 having computer-aided engineering (CAE) 60 and computer-aided design (CAD) 70 tools are accessible from storage 20 for execution by processor 30. Generally, CAE tool 60 provides designer/user with conventional synthesis 81 and/or schematic capture 82 tools to generate a prototype circuit definition 83, for example, EDIF-compliant netlist file. Ordinarily netlist 83 is received by CAD tool 70, possibly after component pre-placement step 85, for physical definition (i.e., chip or board-level placement of components or cells, and routing or signal interconnect therebetween), thereby generating a representative lay-out file (e.g., PG tape).

In accordance with an important aspect of the present invention, however, conventional EDA methodology is modified to include datapath compile or structure compaction or processing step 84 between netlist definition 83 and CAD tool 70, preferably prior to pre-placement 85. Generally, compilation 84 encompasses receiving and analyzing a circuit definition file (netlist 83) to determine which, if any, circuit portions included therein are deemed structural or effectively data-path portions, and generating therefrom another definition file, preferably in physical lay-out format, for pre-placement 85. To achieve physical compaction of the prototype circuit, the structural portion is placed in a selected location of the chip or board substrate.

Figure 2:
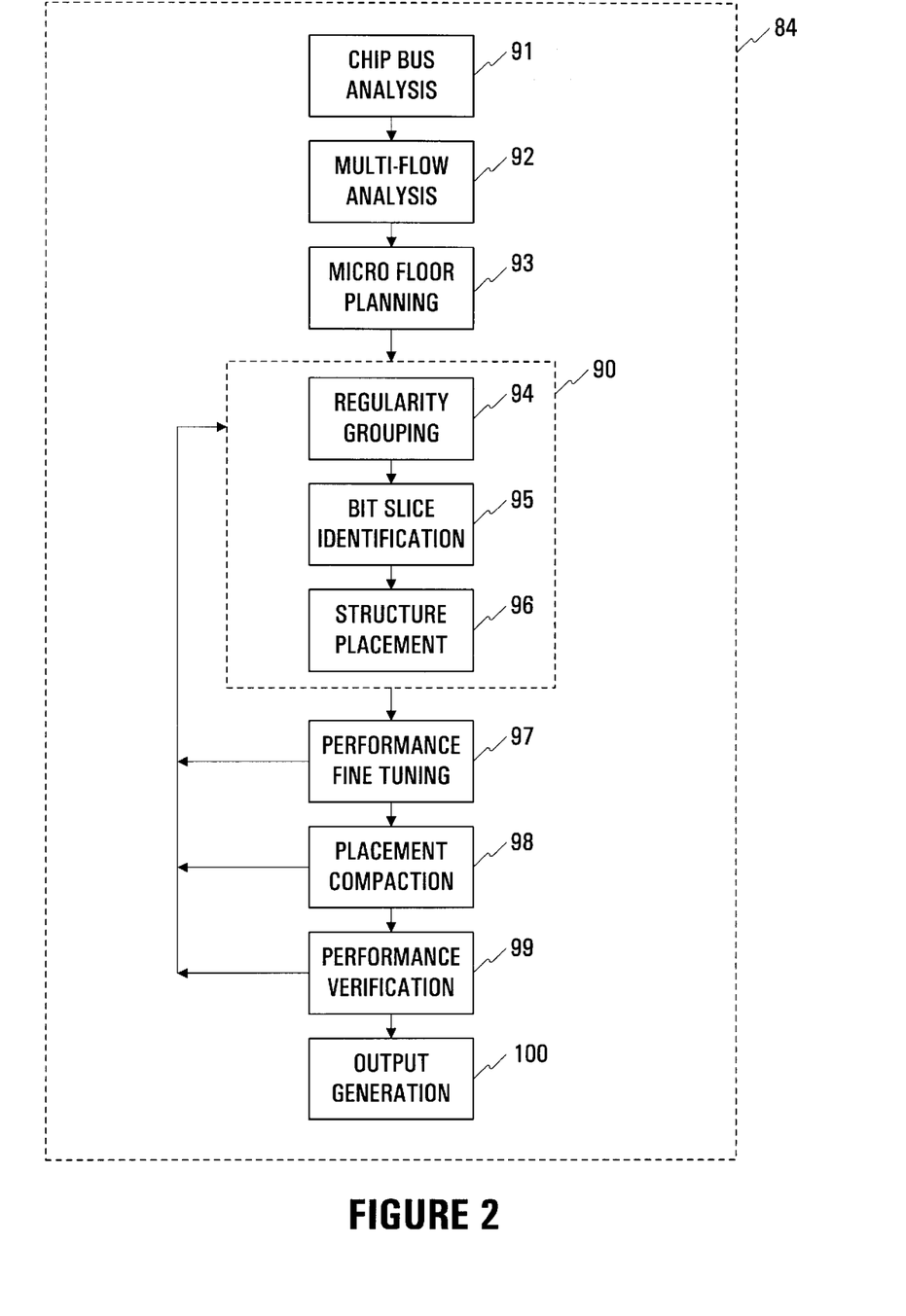
FIG. 2 is a flow chart 84 illustrating a preferred methodology for implementing the present invention.
Figure 3:
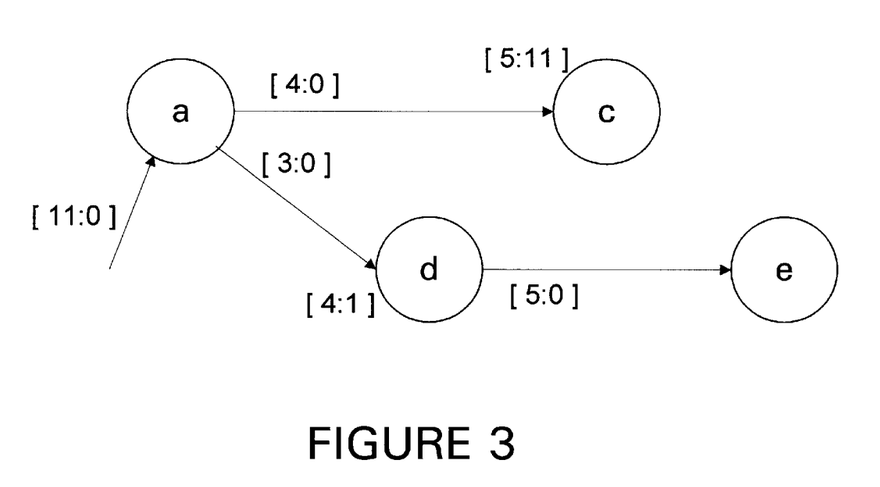
FIG. 3 is a sample bus graph for illustrating an aspect of the present invention.

FIG. 2 is a flow chart which shows preferred functions which may be associated generally with compilation 84. Initially, chip bus structure 91 is identified, and multi-flow signal analysis 92 identifies particular bus structure and data flow. Preferably, recursive bus analysis is performed, for example, by constructing bus graph, as shown in FIG. 3. In this way, analysis is started from nodes closest to user-specified bit slice. Then nodes may be aligned "greedily" until each path is traversed. Final offset is voting of every incoming path offset.

Bus analysis is performed in order to determine circuit operation, such that circuit lay-out is distributed evenly. Accordingly, correct alignment is preferable. Initially, bus graph is constructed, representing an abstract circuit view. Node represent bus signal, and edge represent bus connection. When two buses are merged into a single bus through a logic group, two paths are created. Each edge has an associated weight, representing logic size for processing operation. Thus, by constructing bus graph, logical relationship between each operation branch is determined. Here, bus is aligned such that there are no excessive operations concentrated in a particular chip location. Alignment involves preplacement of logic according to each operation size. Each bit-slice size is uniform.

Bus analysis procedure is hence summarized as follows: (1) construct bus graph, (2) first align bus using depth first traverse, (3) when each path is traversed, node offset is determined, (4) total sum for each bit-slice is calculated by adding weight of every incident edge and divide by bit width, and (5) if one bit-slice is excessive, then find least width logic and move to less populated bit-slices. Procedure may be repeated until each bit-slice has approximately same total weight.

Micro floor-planning 93 may be perforated to decide any bus routing structure, as well as decide location of any megacells or core logic and identify datapath block locations. Regularity grouping 94 may be performed to create datapath generator groups based on connectivity and topology. Also using rectangle-covering approach, special cells may be grouped as shown in connectivity matrices in FIGS.

Figure 7A:
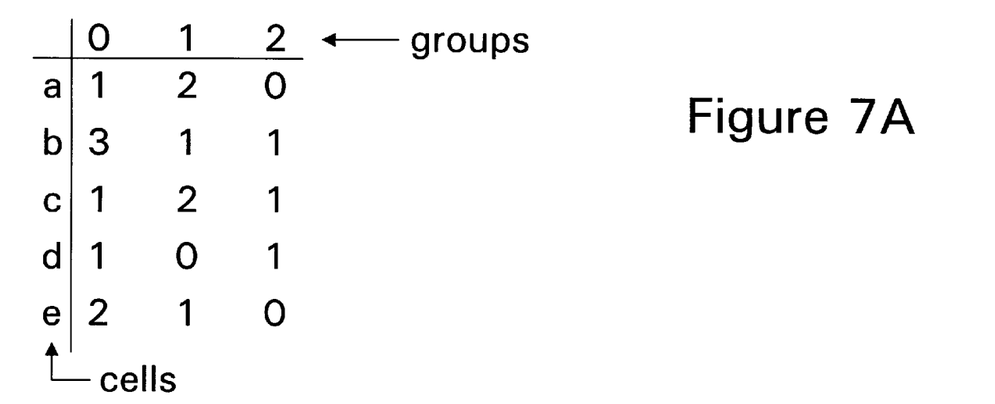
FIGS. 7A, 7B and 7C are sample connectivity matrices for illustrating an aspect of the present invention.
Figure 7B:
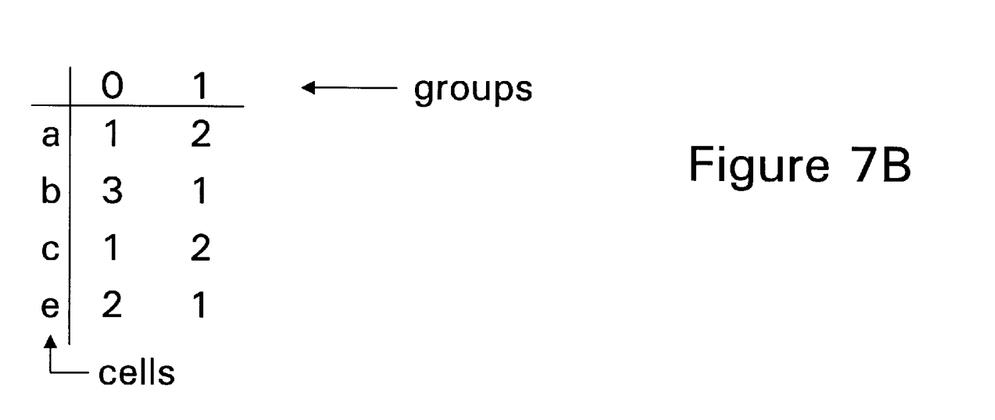

7A, 7B and 7C. Initially, connectivity matrix (7A) is created between cells and existing groups, such that matrix elements represent weight of connectivity. Then grouping is achieved by finding biggest rectangle in matrix (7B), for example, such that a new group may be formed using cells a and c.

Figure 7C:
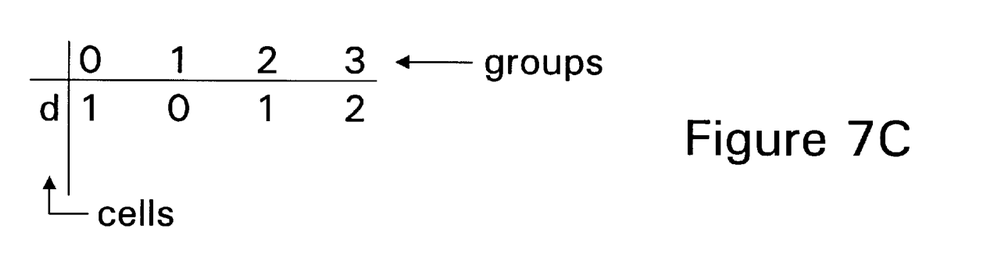

Procedure for regularity grouping 94 is preferably as follows: (1) group cells connected to same bus signals, (2) group cells sharing same control signals, (3) connectivity matrix (e.g., shown in FIG. 7A) is created between cells and existing groups, such that matrix elements represent weight of connectivity between cells and existing groups, (4) find biggest rectangle from connectivity matrix, (5) biggest rectangle should have at least four rows/four cells in order to be constructed as a new group, (6) form new group according to biggest rectangle found, (7) update connectivity matrix (e.g., 7A) to new connectivity matrix (e.g., 7C), (8) repeat steps (4)–(7) until cannot find any meaningful rectangles.

Procedure for rectangle covering is preferably as follows: (1) from cells and groups' connectivity matrix (e.g., FIG. 7A), find biggest column, e.g., column 0 in FIG. 7A representing five cells (a,b,c,d,e) connected to group 0. Biggest column forms initial rectangle, (2) length of column must not be shorter than four in order to form a meaningful group, (3) recursive find of second largest columns to merge with previously-found rectangle. Pick largest rectangle from merged rectangles, (4) cost function of rectangle is defined as column length times row length.

Additionally, matrix transformation may be performed to reduce group communication. This is done by creating a group-group connectivity matrix, where matrix element represents weight of connectivity. The cost function is defined as total non-zero elements in group—group connectivity matrix. Then may use greedy approach to perform cell swap between groups. When overall cost cannot be reduced further, cell swapping process ends.

Figure 4:
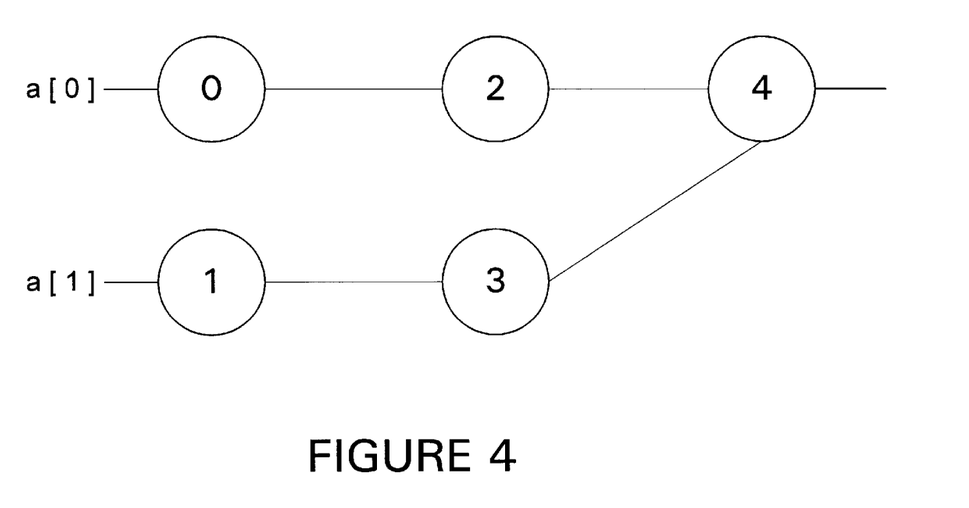
FIG. 4 is a sample cell-connectivity graph for illustrating an aspect of the present invention.

Bit-slice identification or assignment 95 is performed to identify any bit-slice structure based on probability analysis. In this regard, FIG. 4 shows a sample cell-connectivity graph, for performing probability analysis. Here, depth-first-search is used from input and output to traverse through entire circuit, and front trace probability and back trace probability are decided for each cell. From the cell-connectivity graph, for example, node0 and node1 in bit slice 0's probability is one, while node4 in bit slice 0's probability is 0.5.

Bit-slice identification 95 serves to minimize vertical wire, minimize number of vias in y-direction, and distribute cells evenly to each bit-slice such that each bit-slice has similar length. Cost function for wire-length minimization can be defined as: cost=$\Sigma(y_i-y_n)$, for each cell i with position $y_i$ and cell i belongs to net n with position $y_n$. Net position is defined as center position of cells in net. For bit-slice identification, the primary output are first assigned to different bit-slice according to PI or PO's bus name and bit index. For example, if PI has name DATA[1], signal assigned to bit-slice one. Entire circuit is traversed, and bit-slice number propagated to all cells from PI or from PO.

For circuit traversal and bit-slice assignment or identification, each bit-slice traffic is tracked, such that cell assigned to lowest traffic bit-slice bin. Each bit-slice traffic represents number of cells assigned to bit-slice. Thus, for example, if circuit is traversed from input, and cell has single input, then cell assigned to bit-slice same as input. When cell has multiple inputs, less heavy traffic bit-slice is selected for assignment. Preferably for bit-slice assignment, cells are distributed evenly to different bit-slices.

Furthermore, probability of each cell belonging to each bit-slices, (i.e., using greedy approach) may be calculated to assign cells to highest probability bit slice. This procedure is summarized as follows: (1) depth-first-sorting from input to output for entire circuit, such that each cell input does bit-slice assignment before its output cell; calculate each tell potential probability for assigning cell to every bit-slice bin, (2) add up all potential probability from each cell and determine entire circuit bit-slice traffic, (3) assign each cell to its highest probability bit-slice; when several bit-slice having same probability, select bit-slice with lowest entire circuit bit-slice traffic; after bit-slice assignment, update cell bit-slice probability, (4) repeat until all cells finish bit-slice assignment. Cell width may be include in bit-slice assignment process, since chip utilization depends on bit-slice length.

Greedy algorithm for bit-slice assignment for group improves cell location within group, such that preferably share same control signal or other similar properties. Algorithm steps are summarized as: (1) create matrix M=$[P_{ij}]$, where rows correspond to each cell in group, and columns correspond to each bit slice; $P_{ij}$ represents cell I in bit-slice j's probability, (2) find biggest $P_{ij}$ in matrix M, which is $P_{kh}$, (3) assign cell k to bit slice h and take row k out of matrix M, (4) add cell k's probability $P_{kh}$ to bit-slice h to accumulate each bit slice probability, (5) if bit-slice h is greater than or equal to bit-slice allowed length, take column h out of matrix M such that no more cells are assigned to bit-slice.

An alternate greedy algorithm includes the following procedure: (1) create matrix M=$[P_{ij}]$, where rows correspond to each cell in group, and columns correspond to each bit slice; $P_{ij}$ represents cell I in bit-slice j's probability, (2) if cell K can be assigned only to bit-slice h, assign cell k to bit-slice h and take row k out of matrix M, (3) if bit-slice h is greater than or equal to bit-slice allowed length, take column h out of matrix M, (4) continue steps 2 and 3 till no cells only assigned to specific cell, (5) find biggest $P_{ij}$ in matrix M, which is $P_{kh}$, (6) assign cell k to bit slice h and take row k out of matrix M, (7) add cell k's probability $P_{kh}$ to bit-slice h to accumulate each bit slice probability, (8) if bit-slice h is greater than or equal to bit-slice allowed length, take column h out of matrix M such that no more cells are assigned to bit-slice, (9) repeat steps 2 to 8 until bit-slice assignment complete.

Figure 5:
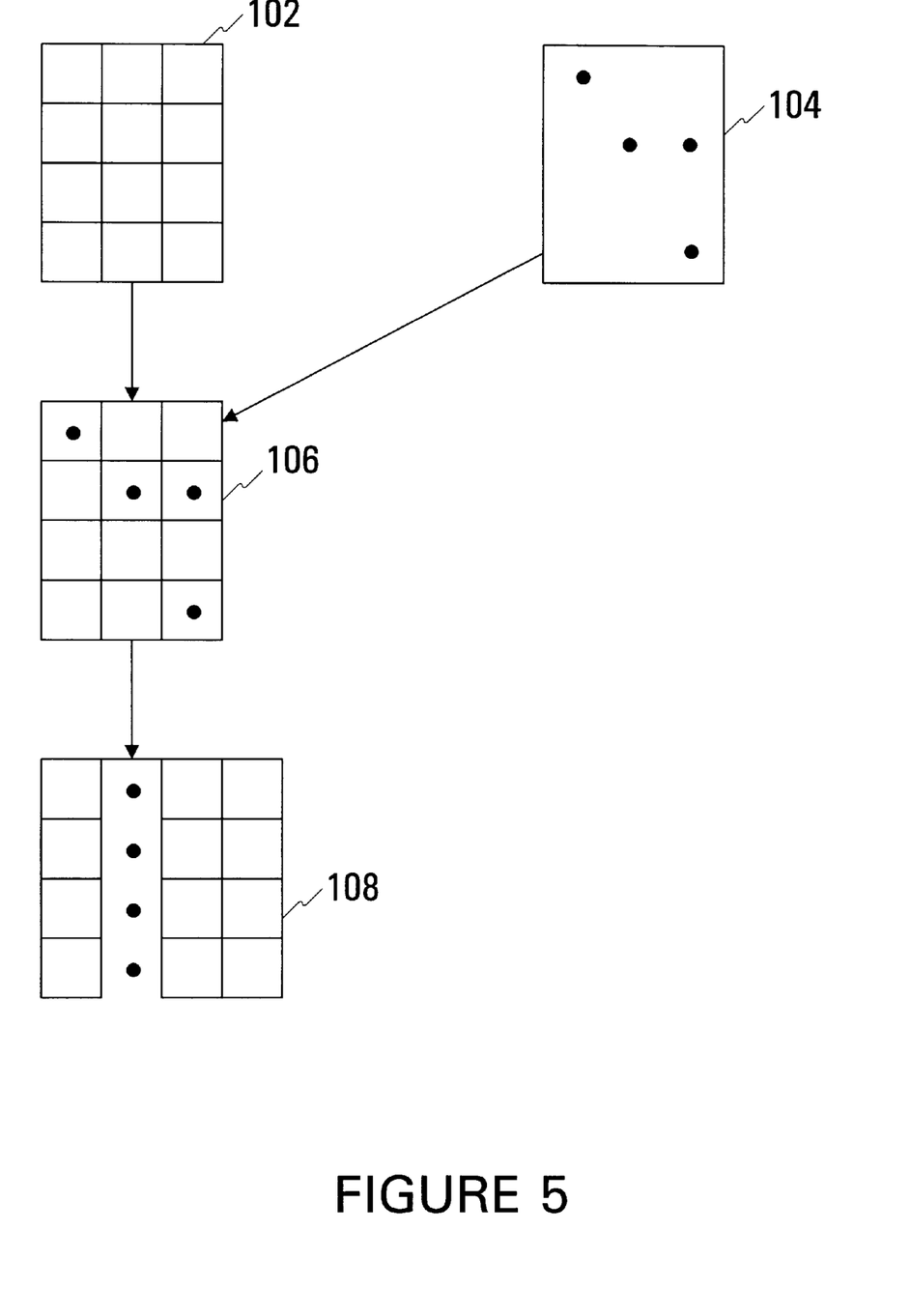
FIGS. 5 and 6 are simplified placement diagrams for illustrating aspects of the present invention.

Then structure placement 96 is performed to decide location of datapath cells and control logic cells, as well as possibly intermixing cells into one module. FIG. 5 shows a sample placement where regular or structural portions 102 are mixed automatically with irregular or nonstructural portions 104. Initially, portions 102, 104 are placed separately, then superimposed 106, such that regular placement 102 is placed on top of irregular placement 104. Then placement is modified 108 to open a new column, or possibly find an empty bin for irregular cells, in order to minimize routing congestion, thereby maximizing area utilization. Further compaction may be effectively achieved by identifying incoming and outgoing terminals of the cluster, applying maximum-flow min-cut analysis to find out the clusters with maximum gain, and performing vertical transformation for each cluster.

Figure 6:
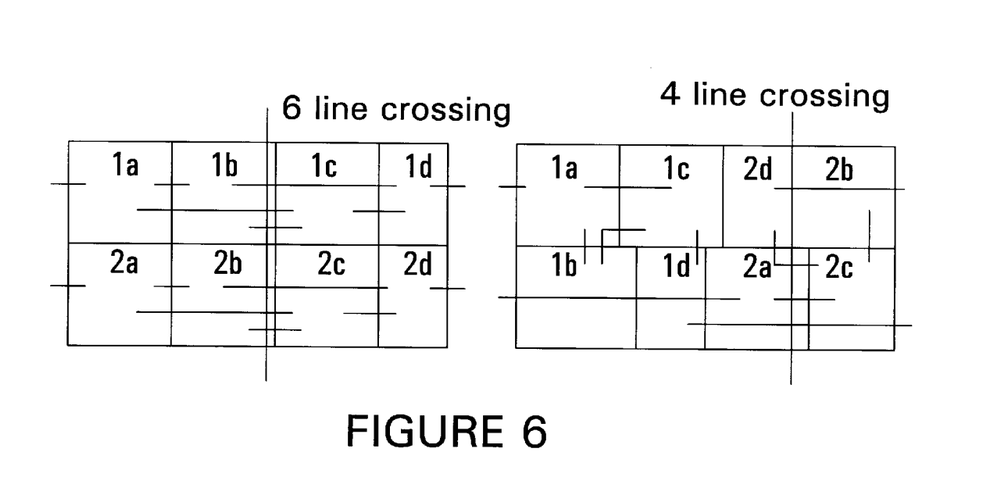

Performance fine-tuning 97 may be done to fine-tune placement according to certain performance constraint, such as wire length and delay timing. FIG. 6 shows sample placement where improvement is achieved further by balancing vertical and horizontal routing resources, for example, from conventional 6-line crossing to new datapath with 4-line crossing.

Figure 8A:
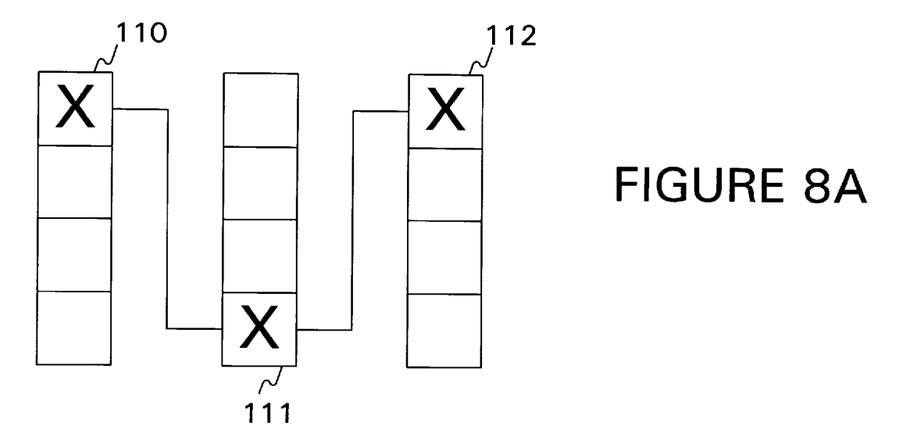
FIGS. 8A and 8B are simplified placement diagrams for illustrating aspects of the present invention.
Figure 8B:
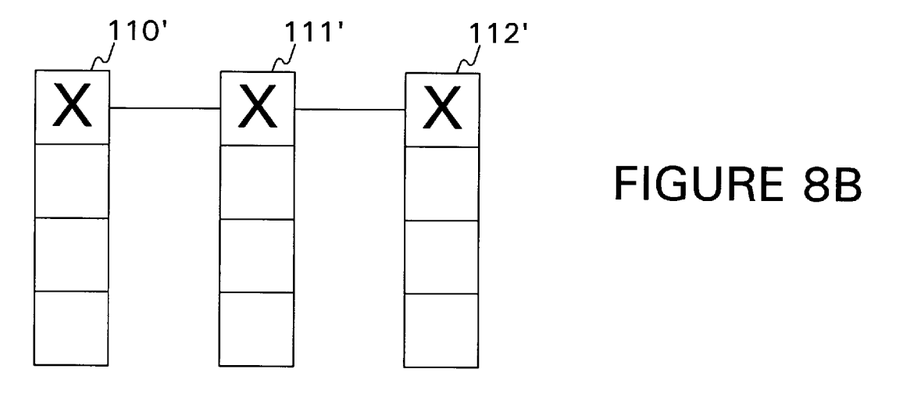
Figure 9:
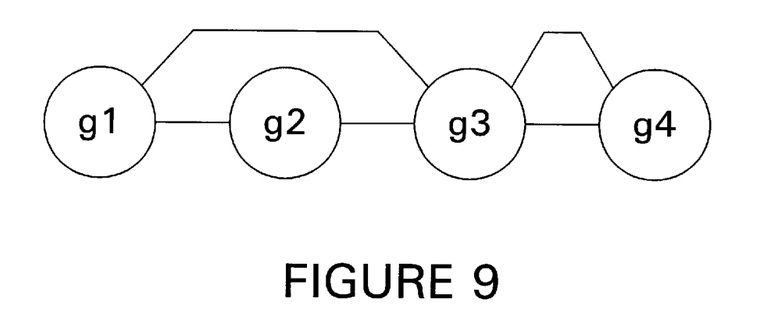
FIG. 9 is a sample group graph for illustrating an aspect of the present invention.

Also critical timing optimization for bit operations may be performed such that circuit structure is considered, preferably with minimal disturbance to bit-slice structure. Thus, for example, FIG. 8A shows sample placement having long critical wires between cells 110, 111, 112. Here, optimization is achieved, as shown in FIG. 8B, by calculating for each column of cells, slack of group, then constructing group graph (as shown in FIG. 9). Slack-based optimization is based on group. For each cell in group, perform for the most critical cell with negative slack: calculate each position weight, determine minimal weight position, shift cells up or down based on original location, then moved cell.

Unlike random timing optimization, datapath still need to maintain regularity of the lay-out, particularly because operation of the data is relatively uniform compared to random logic. Thus, optimization is performed upon first column of cells, then to individual cells within group. Initially, perform timing analysis. Group slack is defined as maximum of slack in components of the group. Bounding box for each path is computed based on estimated slack (i.e., delta=min(required-arrival). Total length of path is calculated from delta. (Refer to approach used by J. Frankle, Iterative and adaptive slack allocation for performance driven layout and FPGA routing", Proc. 19th Design Automation Conference, pp. 536–542, 1992.) To solve x location of each group, after x location is fixed for group, overall group location is optimized. Then, optimize components in the group. Cells in group are adjusted by using slack as well. Relative location is kept, except for critical components, which are moved vertically in as short a distance as possible.

Procedure for balancing horizontal and vertical routing resource improves routability after initial placement (which tends to maximize horizontal communication and minimize vertical communication due to nature of datapath circuit). In this regard, preferably, vertical covers control signals, and horizontal covers data signals. Other approach may involve concentrating on reduction of vertical wire because of data-path nature. In actual lay-out, however, routing resource is fixed. Thus, it is possible that horizontal routing resource will not be adequate to to hold oprimal horizontal communication.

Hence, it is necessary to balance vertical and horizontal routing resource when such insufficienty is encountered. Preferably, the balancing procedure includes the following: (1) routability analysis, (2) identify routing critical region (e.g., coordinates (left, bottom)(right, top)), (3) form repair region (e.g. left−XWINDOW, bottom−YWINDOW)(right+XWINDOW, top+YWINDOW)), (4) find clusters in region; for each cluster: (5) find maximum internal cut numbers (e.g., ni), (6) find number of signals from left (e.g., nl), (7) find number of signals to the right (e.g., nr), such that if ni>(nl+nr) then do transformation as follows: (I) transform ncells in ith row into n row such that horizontal communication is minimized, and let k equal 0, for each row from I+1 to i+n−1 rows, transform ncells, the same order as in ith row, shift row by k, and increment k. Preferably result is to keep same area but with minimal disturbance to bit slice.

Further placement compaction 98 may be done to compact placement for better utilization. Performance verification 99 may be done for validating cross-talk and timing (e.g., RC delays). After steps 97, 98, 99, steps 90 may be repeated prior to output generation for preplacement 85.

Figure 10A:
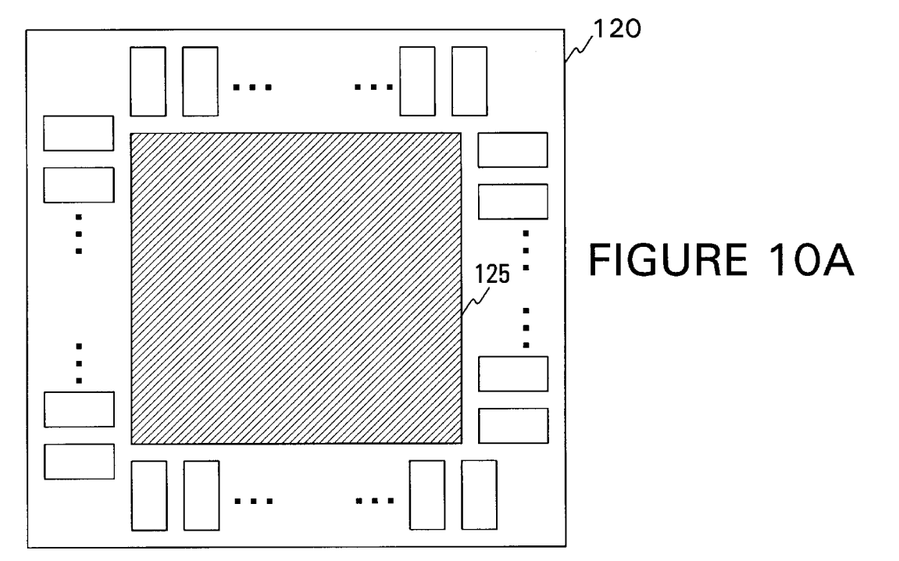
FIGS. 10A and 10B are simplified placement diagrams for illustrating aspects of the present invention.
Figure 10B:
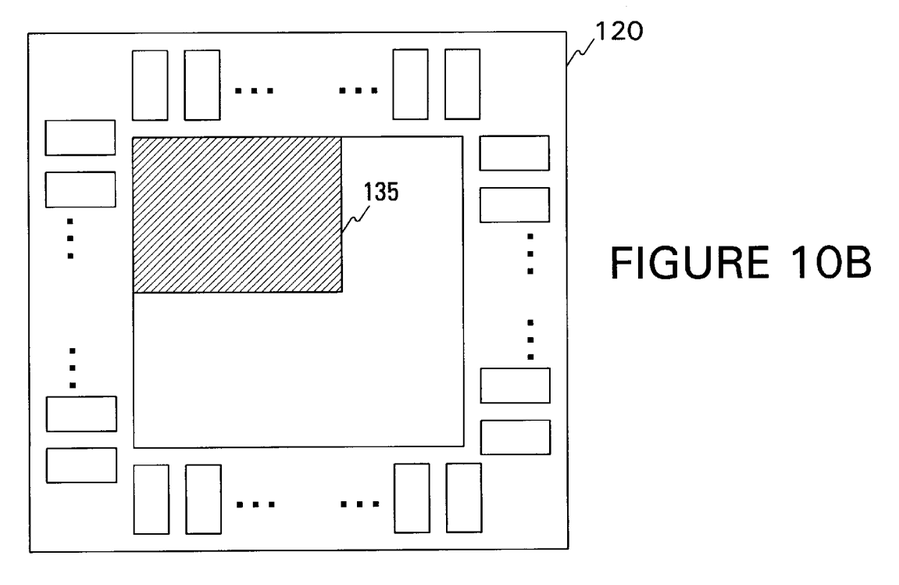

Based on actual placement according to the preferred methodology, significant compaction effect is achievable, as shown in FIGS. 10A and 10B. For example, chip circuit 120 with 45 K gates (0.8 micron, triple-level metal) demonstrated about 30% area reduction and 40% wire reduction between placement regions 125, 135.

Figure 11:
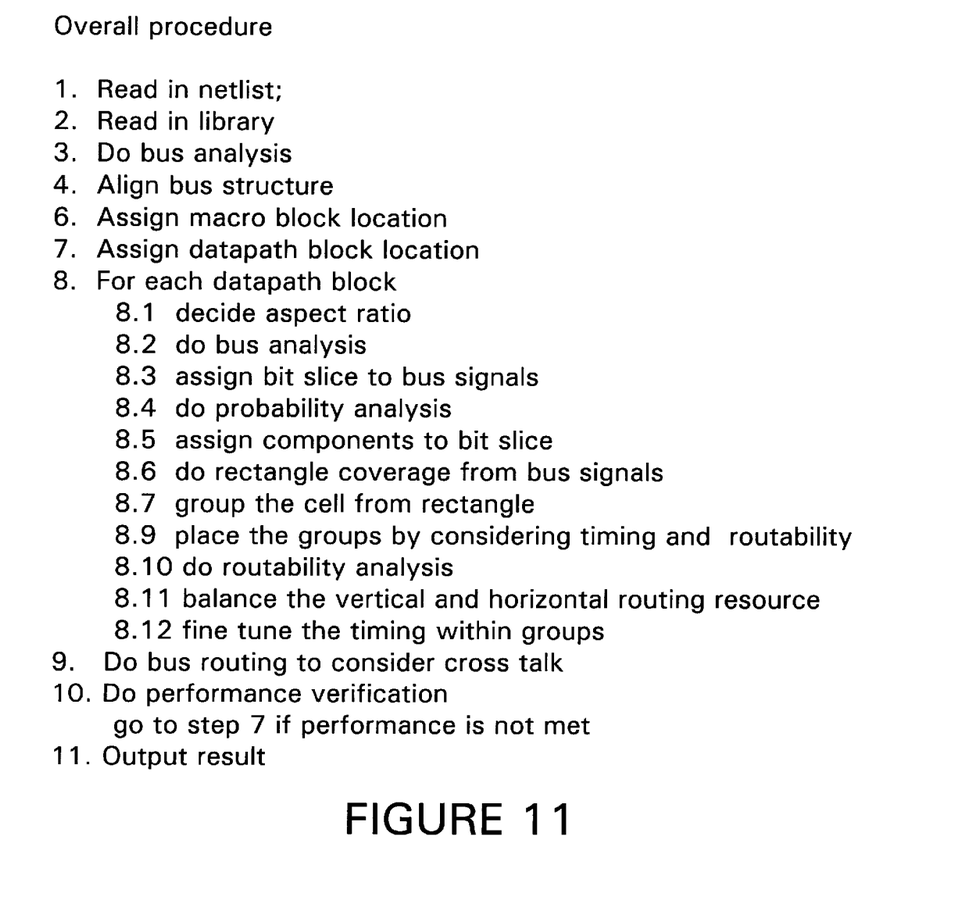
FIG. 11 is sample instructional code for describing aspects of the present invention.

In FIG. 11, representative pseudo-code instructions according to one embodiment of the present invention is provided to summarize overall procedure.

What is claimed is:

1. In an engineering workstation for automating electronic design, a software-implemented process for circuit placement, the process comprising the steps of:
   receiving a netlist file, the netlist file including a plurality of interconnected components;
   identifying which of the interconnected components belong to a structural portion and which belong to a non-structural portion according to bus signals;
   conducting a bus analysis to align the bus signals and to determine a usable bus, the bus analysis being performed with analytic tools;
   identifying a group of cells through set covering that have related connectivity;
   finding a group of cells to form a column;
   assigning cells to a bit slice based on a trace probability, wherein the step of assigning cells to a bit slice by use of a trace probability comprises the steps of:
      depth-first-sorting, from input to output, the cells such that each cell input does bit-slice assignment before its output cell, the depth-first-sorting accomplished by a cell-connectivity graph;
      b) calculating each cell potential probability for assigning the cell to every bit-slice bin; and
      c) adding all potential probability from each cell to determine entire circuit bit-slice traffic;
      d) assigning each cell to its highest probability bit-slice, the cell being assigned to the lowest bit-slice traffic of entire circuit for bit-slices that have the same probability; and
      e) repeating steps a) through d) until all cell finish bit-slice assignment;
   deriving an initial placement through simulated annealing; and
   generating a lay-out for defining physical placement of the interconnected components, the interconnected components identified as belonging to the structural portion being placed in a preferred area.

2. The process of claim 1 wherein the structural portion comprises a data-path circuit.

3. The process of claim 1 wherein the structural portion is determined by identifying a bus circuit.

4. The method of claim 3 wherein a plurality of signal pins for the placed structural portion are defined according to the identified bus circuit.

5. The process of claim 1 further comprising the step of:
   identifying which of the interconnected components belong to a non-structural portion, the non-structural portion being placed amongst the interconnected components belonging to the structural portion.

6. The process of claim 1 wherein the structural portion comprises a plurality of bit slices.

7. The method of claim 6 wherein the structural portion is placed such that a signal timing is constrained for at least one bit slice.

8. The process of claim 1 wherein the structural portion comprises a plurality of routing lines which are balanced vertically and horizontally.

9. The process of claim 1 wherein the structural portion comprises a plurality of cells represented in a connectivity matrix, wherein a rectangle covers such cells in the matrix.

10. The process of claim 1 further comprising the step of swapping structured cells to balance a vertical routing requirement.

11. The process of claim 1 further comprising the step of applying a slack based timing control to group order determination and random cell placement.

12. The process of claim 1 wherein the step of conducting a bus analysis to align the bus signals and to determine a usable bus comprises the steps of:

a) constructing a bus graph to represent an abstract view of a circuit;

b) aligning bus using depth first traverse;

c) determining node offset after each path is traversed;

d) calculating a total sum for each bit-slice by adding a weight for every incident edge and divide by a bit width;

e) finding the least width logic for excessive bit-slices and moving it to a less populated bit-slice; and f) repeating steps a) through e) until each bit-slice has approximately the same total weight.

* * * * *